(12) United States Patent
Shin et al.

(10) Patent No.: US 10,333,101 B2
(45) Date of Patent: Jun. 25, 2019

(54) DISPLAY APPARATUS AND MANUFACTURING METHOD THEREOF INCLUDING DEVELOPING SEALING MEMBER BY CURING MOLTEN SEALING MEMBER PATTERN

(71) Applicant: Samsung Display Co., Ltd., Yongin-si, Gyeonggi-do (KR)

(72) Inventors: Jaewook Shin, Yongin-si (KR); Hyunchul Lee, Yongin-si (KR); Seungjoon Yoo, Yongin-si (KR); Dongjin Kim, Yongin-si (KR); Jeonghyuk Park, Yongin-si (KR); Soojeong Choi, Yongin-si (KR); Wonju Choi, Yongin-si (KR)

(73) Assignee: Samsung Display Co. Ltd., Yongin-si (KR)

( * ) Notice: Subject to any disclaimer, the term of this patent is extended or adjusted under 35 U.S.C. 154(b) by 45 days.

(21) Appl. No.: 15/345,356

(22) Filed: Nov. 7, 2016

(65) Prior Publication Data
US 2017/0200916 A1    Jul. 13, 2017

(30) Foreign Application Priority Data
Jan. 8, 2016  (KR) .................. 10-2016-0002800

(51) Int. Cl.
| H01L 29/08 | (2006.01) |
| H01L 51/52 | (2006.01) |
| H01L 23/544 | (2006.01) |
| H01L 51/56 | (2006.01) |
| H01L 27/32 | (2006.01) |

(52) U.S. Cl.
CPC ........ *H01L 51/5246* (2013.01); *H01L 23/544* (2013.01); *H01L 51/56* (2013.01); *H01L 27/3244* (2013.01); *H01L 51/525* (2013.01); *H01L 2227/323* (2013.01)

(58) Field of Classification Search
CPC . H01L 51/5246; H01L 51/524; H01L 23/544; H01L 2224/03005; H01L 2224/03015
See application file for complete search history.

(56) References Cited

U.S. PATENT DOCUMENTS

| 2011/0177746 A1 | 7/2011 | Voronov et al. |
| 2012/0287026 A1* | 11/2012 | Masuda ............. H01L 51/5246 345/76 |
| 2015/0021573 A1 | 1/2015 | Kwak |

(Continued)

FOREIGN PATENT DOCUMENTS

| KR | 10-2011-0085135 A | 7/2011 |
| KR | 10-2012-0076065 A | 7/2012 |

(Continued)

*Primary Examiner* — Matthew E. Gordon
(74) *Attorney, Agent, or Firm* — Lewis Roca Rothgerber Christie LLP

(57) ABSTRACT

A display apparatus includes a first substrate corresponding to an active area, and a sealing area surrounding the active area, a second substrate facing the first substrate, a display portion in the active area, a sealing member in the sealing area between the first substrate and the second substrate, and a guide mark on one surface of the second substrate in an area where the sealing member and the second substrate overlap each other.

11 Claims, 10 Drawing Sheets

(56) References Cited

U.S. PATENT DOCUMENTS

2015/0102295 A1    4/2015  Hong
2015/0255740 A1*   9/2015  Nakada .............. H01L 51/0097
                                                        257/40
2015/0357595 A1    12/2015 Hong

FOREIGN PATENT DOCUMENTS

KR    10-2015-0011081 A    1/2015
KR    10-2015-0043136 A    4/2015
KR    10-2015-0049141 A    5/2015

* cited by examiner

DISPLAY APPARATUS AND MANUFACTURING METHOD THEREOF INCLUDING DEVELOPING SEALING MEMBER BY CURING MOLTEN SEALING MEMBER PATTERN

CROSS-REFERENCE TO RELATED APPLICATION

This application claims priority to, and the benefit of, Korean Patent Application No. 10-2016-0002800, filed on Jan. 8, 2016, in the Korean Intellectual Property Office, the disclosure of which is incorporated herein in its entirety by reference.

BACKGROUND

1. Field

Embodiments of the present disclosure relate to a display apparatus and a manufacturing method thereof.

2. Description of the Related Art

As technology information develops, a market for display apparatuses that are media for connecting users and information has grown. The display apparatus has been developed in a variety of forms. Among the various forms, an organic light-emitting display apparatus has been highlighted as a display apparatus having superior characteristics, such as being thin, being light, and consuming low power.

An organic light-emitting display apparatus includes an organic light-emitting device in a display area. Because the organic light-emitting device is very sensitive to moisture and oxygen, deterioration of an organic light-emitting device due to intrusion of moisture and/or oxygen should be reduced or prevented. As one method to address the aforementioned issues, an upper substrate and a lower substrate are closely coupled to each other by using a sealing member. In this regard, the coupling may be accompanied by a process of irradiating a laser beam onto a pattern to be formed as a sealing member layer.

However, in the case of an existing display apparatus and a manufacturing method thereof, there is a limit in irradiating a laser beam at an accurate position of a pattern for the sealing member.

SUMMARY

One or more embodiments include a display apparatus capable of improving a positional accuracy between a sealing member and a laser beam during formation of the sealing member, and a manufacturing method thereof.

Additional aspects will be set forth in part in the description which follows and, in part, will be apparent from the description, or may be learned by practice of the presented embodiments.

According to one or more embodiments, a display apparatus includes a first substrate corresponding to an active area, and a sealing area surrounding the active area, a second substrate facing the first substrate, a display portion in the active area, a sealing member in the sealing area between the first substrate and the second substrate, and a guide mark on one surface of the second substrate in an area where the sealing member and the second substrate overlap each other.

The guide mark may extend in a lengthwise direction of the sealing member.

The guide mark may include a plurality of marks each extending in a lengthwise direction of the sealing member.

The guide mark may include a plurality of first marks along a virtual first row extending in a lengthwise direction of the sealing member, and a plurality of second marks along a virtual second row extending in the lengthwise direction of the sealing member.

A distance between the virtual first row and the virtual second row may be substantially constant.

A distance between the guide mark and the active area may be less than a distance between a center of the sealing member and the active area.

The display apparatus may further include a touch screen wiring on an outer surface of the second substrate that is opposite to an inner surface of the second substrate contacting the sealing member, wherein the guide mark may be arranged on the outer surface of the second substrate.

The guide mark may include a same material as a material of the touch screen wiring.

The guide mark may include a heat-resistant material.

According to one or more embodiments, a method of developing a display apparatus includes preparing a first substrate having an active area, and a sealing area surrounding the active area, developing a display portion in the active area of the first substrate, preparing a second substrate having an active area and a sealing area respectively corresponding to the active area and the sealing area of the first substrate, developing a guide mark on one surface of the second substrate in the sealing area of the second substrate, developing a sealing member pattern in the sealing area of the first substrate or in the sealing area of the second substrate, arranging the second substrate above the first substrate such that the sealing area of the first substrate faces the sealing area of the second substrate, melting the sealing member pattern by irradiating a laser beam onto the guide mark, and developing a sealing member by curing a molten sealing member pattern.

The method may further include developing a touch screen wiring of a same material as the guide mark.

The guide mark may be located within an area where the sealing member pattern and the second substrate overlap each other.

A distance between the guide mark and the active area of the second substrate may be shorter than a distance between a center of the sealing member and the active area of the second substrate.

The guide mark may have a shape extending in a lengthwise direction of the sealing member.

The guide mark may include a plurality of marks each having a shape extending in a lengthwise direction of the sealing member.

The guide mark may include a plurality of first marks arranged along a virtual first row extending in a lengthwise direction of the sealing member, and a plurality of second marks arranged along a virtual second row extending in the lengthwise direction of the sealing member.

A distance between respective ones of the first marks and respective ones of the second marks may be substantially constant.

The melting the sealing member pattern by irradiating a laser beam onto the guide mark may include irradiating the laser beam in a gap area between the plurality of first marks and the plurality of second marks.

The melting the sealing member pattern by irradiating a laser beam onto the guide mark may include irradiating the laser beam in a direction from the second substrate to the first substrate.

The guide mark may include a heat-resistant material.

BRIEF DESCRIPTION OF THE DRAWINGS

These and/or other aspects will become apparent and more readily appreciated from the following description of the embodiments, taken in conjunction with the accompanying drawings, in which.

DETAILED DESCRIPTION

Figure 1:
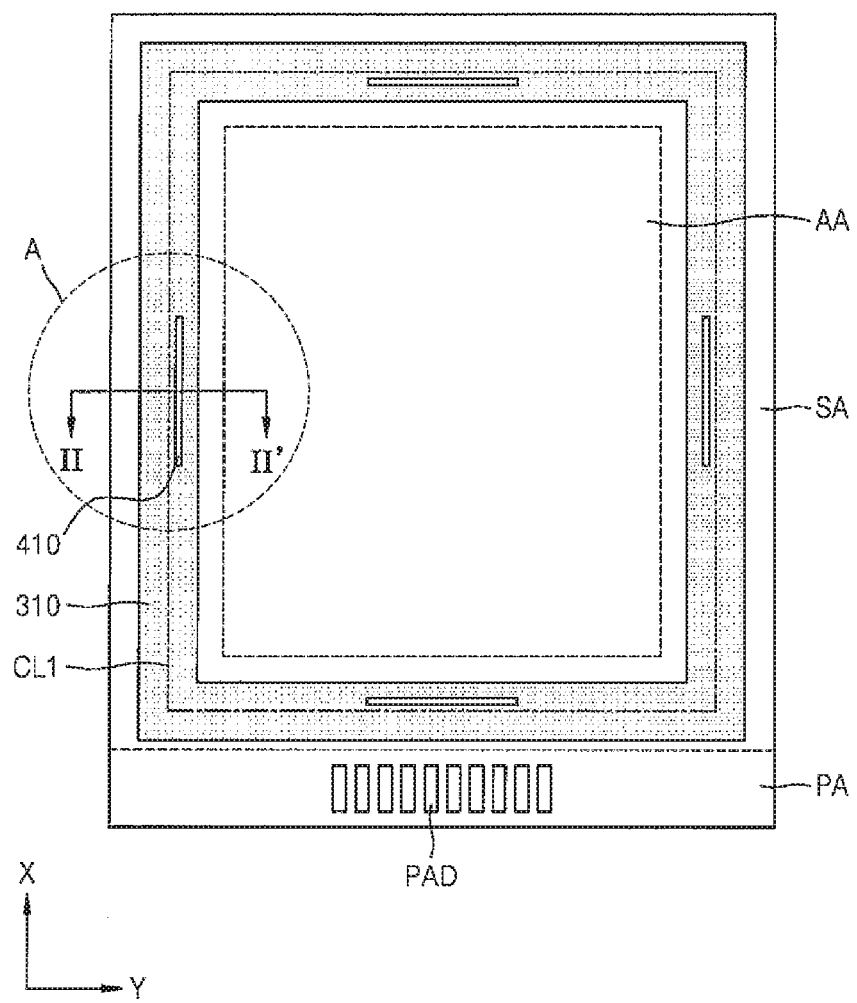
FIG. 1 is a plan view schematically illustrating a display apparatus according to an embodiment.

Features of the inventive concept and methods of accomplishing the same may be understood more readily by reference to the following detailed description of embodiments and the accompanying drawings. Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
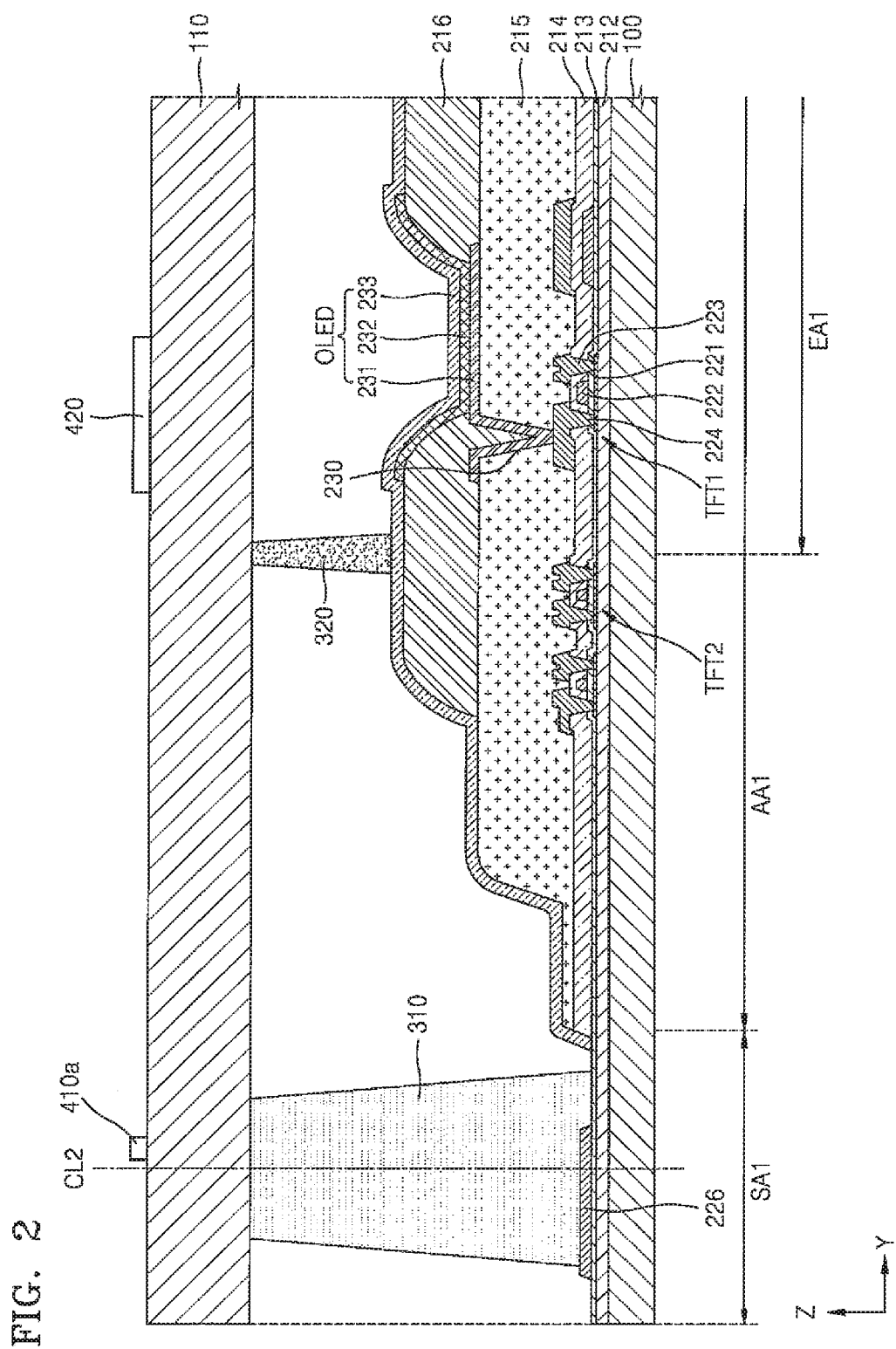
FIG. 2 is a cross-sectional view taken along the line II-II' of FIG. 1.
Figure 3:
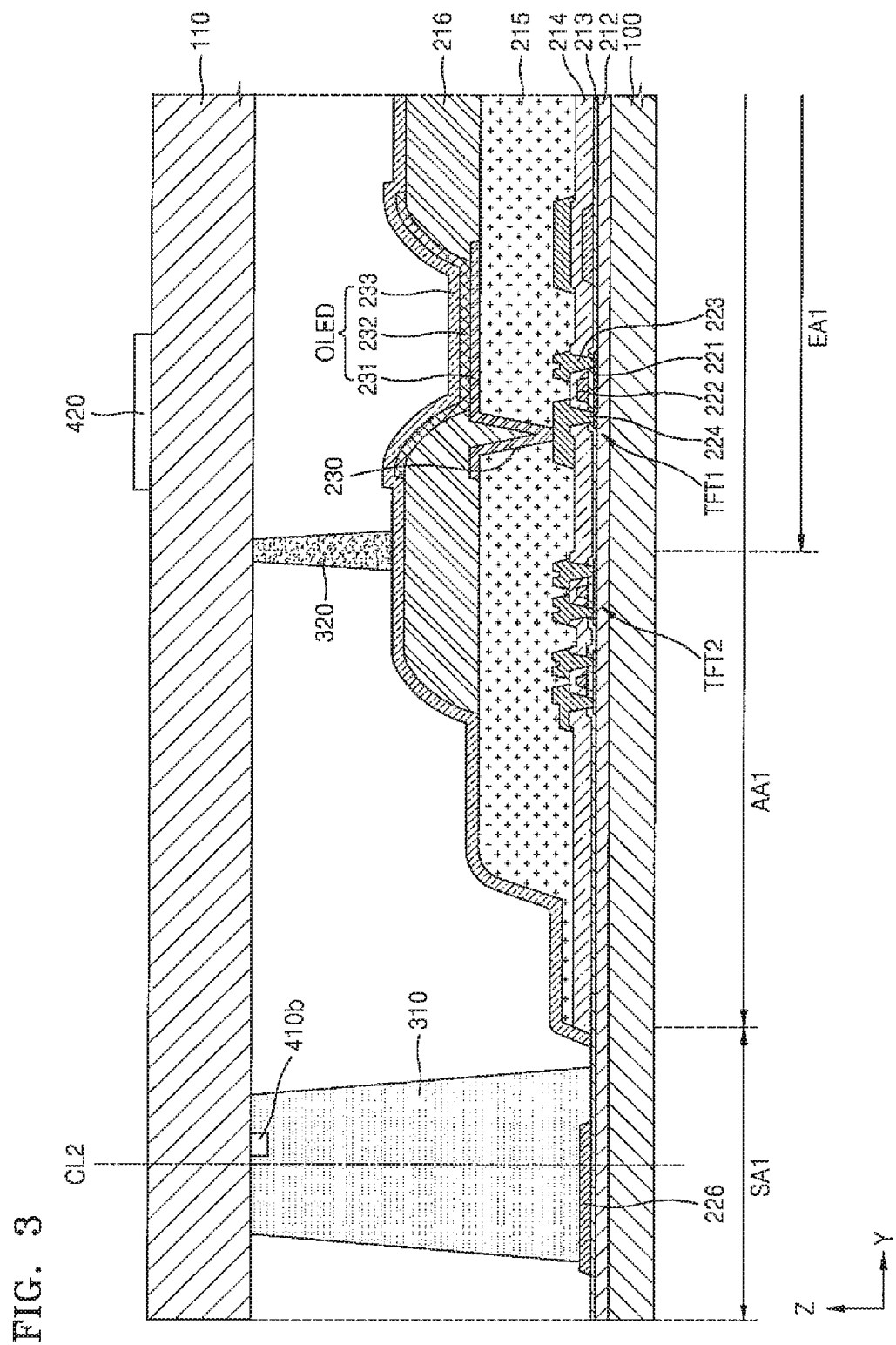
FIG. 3 is a cross-sectional view schematically illustrating a display apparatus according to another embodiment.

FIG. 1 is a plan view schematically illustrating a display apparatus according to an embodiment, FIG. 2 is a cross-sectional view taken along the line II-II' of FIG. 1, and FIG. 3 is a cross-sectional view schematically illustrating a display apparatus according to another embodiment.

First, referring to FIGS. 1 and 2, the display apparatus according to an embodiment may include a first substrate 100, a second substrate 110, a sealing member 310, and a guide mark 410 (e.g., upper surface guide mark 410a in FIG. 2 or lower surface guide mark 410b in FIG. 3). The first substrate 100 and the corresponding second substrate 110 may include an active area AA (e.g., AA1 in FIGS. 2, 3, 7, and 10, and AA2 in FIGS. 8 and 9), the active area AA corresponding to a display area, and a sealing area SA (e.g., SA1 in FIGS. 2, 3, 7, and 10, and SAA2 in FIGS. 8 and 9), the sealing area SA corresponding to is a non-display area.

A display portion is arranged in an active area AA1 of the first substrate 100. The display portion may have a variety of shapes according to the type of the display apparatus. However, in the following description, a display portion including an organic light-emitting device (OLED) is mainly discussed for convenience of explanation. This applies to embodiments and modified examples thereof, which are described below.

The active area AA1 of the first substrate 100 may include a light-emitting area EA1 for emitting light to the outside. First thin film transistors TFT1, and the organic light-emitting devices (OLEDs) connected thereto, may be arranged in the light-emitting area EA1 of the first substrate 100. The OLEDs electrically connected to the first thin film transistors TFT1 may have pixel electrodes 231 electrically connected to the first thin film transistors TFT1. A second thin film transistor TFT2 may be arranged in an area surrounding the light-emitting area EA1 of the active area AA1 of the first substrate 100. The second thin film transistor TFT2 may be, for example, a part of a circuit portion to control transmission of an electrical signal in the light-emitting area EA1.

A counter electrode 233 of the OLED is arranged in the active area AA1 of the first substrate 100. The counter electrode 233 is arranged facing the first substrate 100, such that the first thin film transistors TFT1 and the pixel electrodes 231 are inside a space between the counter electrode 233 and the first substrate 100.

A variety of wirings and drivers connected to the wirings for transmitting electrical signals or voltages to pixels may be arranged in an area surrounding the light-emitting area EA1 of the active area AA1 of the first substrate 100. For example, a horizontal circuit portion 226 for driving a plurality of horizontal wirings extending in a Y-axis direction may be arranged in the area surrounding the light-emitting area EA1 of the active area AA1 of the first substrate 100. The horizontal wirings may be scan lines that are connected to the pixels for transmitting scan signals. The drivers including the horizontal circuit portion 226 extend toward a pad area PA of the first substrate 100 and are connected to a pad portion PAD arranged in the pad area PA, as shown in FIG. 1.

The first substrate 100 may be formed of a glass material, a plastic material, and/or a metal material.

Thin film transistors may be arranged in the active area AA1 of the first substrate 100. Each of the first thin film transistor TFT1 and the second thin film transistor TFT2 may include an active pattern 221, a gate electrode 222, and source and drain electrodes 223 and 224.

A buffer layer 212 may be formed on the first substrate 100. The buffer layer 212 is a layer that prevents intrusion of impurities/impure elements through the first substrate 100, and that provides a flat surface on the first substrate 100. The buffer layer 212 may be formed of various materials capable of performing the above described functions. For example, the buffer layer 212 may include an inorganic material or an organic material, and may be formed in a plurality of stacks.

The active pattern 221 may be formed of an inorganic semiconductor or an organic semiconductor, such as silicon, on the buffer layer 212. The active pattern 221 may have a source region, a drain region, and a channel region between the source and drain regions. For example, when the active pattern 221 is formed using amorphous silicon, an amorphous silicon layer is formed on an overall surface of the first substrate 100, and then the amorphous silicon layer is crystallized to form a polycrystalline silicon layer, which is then patterned. After the patterning, impurities are doped into the source region and the drain region at the edge of the patterned polycrystalline silicon layer so that the active pattern 221 including the source region, the drain region, and the channel region therebetween may be formed.

A gate insulating film 213 is formed on the active pattern 221. The gate insulating film 213 may be formed of an inorganic material, such as $SiN_x$ or $SiO_2$, to insulate the active pattern 221 and the gate electrode 222.

The gate electrode 222 is formed in a certain area on the gate insulating film 213. The gate electrode 222 is connected to the scan line for transmitting an on/off signal to the first thin film transistors TFT1.

The gate electrode 222 may include Au, Ag, Cu, Ni, Pt, Pd, Al, and/or Mo, or an alloy such as Al:Nd and/or Mo:W, but is not limited thereto, and may be formed of various materials considering design conditions.

The scan lines are formed on the same layer as the gate electrode 222.

Furthermore, the horizontal circuit portion 226 for transmitting scan signals to the respective pixels through the scan lines may be arranged on the same layer as the gate electrode 222. The scan line may be formed of the same material as that of the gate electrode 222.

An interlayer insulating film 214 is formed on the gate electrode 222 to insulate the gate electrode 222 from the source electrode 223 and from the drain electrode 224, and may be formed of an inorganic material, such as silicon nitride $SiN_x$ and/or silicon oxide $SiO_2$ in a single layer or in a multilayer.

The source electrode 223 and the drain electrode 224 are formed on the interlayer insulating film 214. In detail, the interlayer insulating film 214 and the gate insulating film 213 are formed to expose the source region and the drain region of the active pattern 221, and the source electrode 223 and the drain electrode 224 are formed to respectively contact the exposed source and drain regions of the active pattern 221.

Wirings for transmitting data signals to the respective pixels, and wirings for transmitting a power voltage, are formed on the same layer as the source electrode 223 and the drain electrode 224. The wirings are formed roughly parallel to one direction. For example, as shown in FIG. 1, the wirings may be parallel in the X-axis direction.

FIG. 2 illustrates the thin film transistors of a top gate type sequentially including the active pattern 221, the gate electrode 222, the source electrode 223, and the drain electrode 224. However, the present disclosure is not limited thereto, and the gate electrode 222 may be arranged under the active pattern 221.

A protective film 215 may cover the source electrode 223 and the drain electrode 224 of the first thin film transistors TFT1 to thereby protect the first thin film transistors TFT1. The protective film 215 may be formed of an organic material, for example, a general purpose polymer PMMA or PS, a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, and/or a blend hereof.

The OLED may include one of the pixel electrodes 231, an intermediate layer 232, and the counter electrode 233.

The pixel electrode 231 is formed on the protective film 215, and is electrically connected to the drain electrode 224 via a contact hole 230 formed in the protective film 215.

The pixel electrode 231 may be formed as a transparent or semi-transparent electrode, or may be formed as a reflective electrode. When the pixel electrode 231 is formed as a transparent/semi-transparent electrode, the pixel electrode 231 may be formed of, for example, ITO, IZO, ZnO, $In_2O_3$, IGO, and/or AZO. When the pixel electrode 231 is formed as a reflective electrode, the pixel electrode 231 may have a reflective film formed of Ag, Mg, Al, Pt, Pd, Au, Ni, Nd, Ir, Cr, and/or a compound thereof and a layer formed of ITO, IZO, ZnO, $In_2O_3$, IGO, and/or AZO. The present disclosure is not limited thereto, and the pixel electrode 231 may be formed of a variety of materials. Also a structure of the pixel electrode 231 may be variously modified to be a single layer or a multilayer.

The counter electrode 233 arranged to face the pixel electrode 231 may be formed as a transparent or semi-transparent electrode or a reflective electrode. When the counter electrode 233 is formed as a transparent/semi-transparent electrode, the counter electrode 233 may include a layer formed of a metal having a low work function, such as Li, Ca, LiF/Ca, LiF/Al, Al, Ag, Mg, and/or a compound thereof, and may include a transparent/semi-transparent conductive layer formed of a material such as ITO, IZO, ZnO, and/or $In_2O_3$. When the counter electrode 233 is formed as a reflective electrode, the counter electrode 233 may include a layer formed of Li, Ca, LiF/Ca, LiF/Al, Al, Ag, Mg, and/or a compound thereof. The structure and material of the counter electrode 233 are not limited thereto, and modifications thereof are compatible with the disclosed embodiments.

Accordingly, the counter electrode 233 may transmit light emitted from an organic light-emitting layer included in the intermediate layer 232. In other words, the light emitted from the organic light-emitting layer may be directly transmitted toward the counter electrode 233, or may be reflected by the pixel electrode 231 as a reflective electrode.

However, the display apparatus according to the present embodiment is not limited to the top emission type, and may instead include a bottom emission type that emits the light from the organic light-emitting layer toward the first substrate 100. When the display apparatus according to the present embodiment is a bottom emission type, the pixel electrode 231 may be formed as a transparent or semi-transparent electrode, and the counter electrode 233 may be formed as a reflective electrode. Furthermore, the display apparatus according to the present embodiment may be a dual emission type that emits light in opposing directions through the top and bottom surfaces.

A pixel defining film 216 is formed of an insulating material on the pixel electrode 231. The pixel defining film 216 exposes a certain area of the pixel electrode 231, and the intermediate layer 232 including the organic light-emitting layer is located in an exposed area.

The intermediate layer 232 may selectively further include a functional layer, such as a hole transport layer (HTL), a hole injection layer (HIL), an electron transport layer (ETL), and an electron injection layer (EIL), in addition to the organic light-emitting layer.

The organic light-emitting layer included in the intermediate layer 232 may be formed of a low molecular organic material or a polymer organic material. The low molecular organic material may include copper phthalocyanine (CuPc), N,N'-Di(naphthalene-1-yl)-N,N'-diphenyl-benzidine (NPB), and/or tris-8-hydroxyquinoline aluminum (Alq3), whereas the polymer organic material may include a poly-Phenylenevinylene (PPV)-based material and/or a polyfluorene-based material.

The second substrate 110 is arranged above the OLED, and faces the first substrate 100.

The second substrate 110 may include a transparent material, and may be formed of a glass material and/or a plastic material, like the first substrate 100. The second substrate 110 may be formed of the same material as that of the first substrate 100.

The sealing member 310 is provided between the first substrate 100 and the second substrate 110 to closely combine the first substrate 100 and the second substrate 110. The sealing member 310 is formed in a sealing area SA1 of the first substrate 100 to surround the active area AA1 of the first substrate 100. The sealing member 310 hermetically seals the active area AA1 of the first substrate 100 to prevent intrusion of moisture or oxygen into the display portion located in the active area AA1. Furthermore, a spacer 320 may be arranged between the first substrate 100 and the second substrate 110 to maintain a gap between the first substrate 100 and the second substrate 110.

The sealing member 310 may overlap at least a part of the wirings included in the horizontal circuit portion 226. As the sealing member 310 is arranged adjacent the active area AA1 as close as possible, a dead space of the display apparatus may be reduced.

The sealing member 310 may be formed by forming a sealing member pattern along an edge of the first substrate 100 or of the second substrate 110 on one surface of the first substrate 100 or second substrate 110, and by then melting the pattern by irradiating a laser beam onto the pattern to develop a molten sealing member pattern and to then cure the pattern. The sealing member 310 may include frit. The frit may include vanadium (V) oxide, bismuth (Bi) oxide, and/or other various materials. The other materials may include, for example, at least one from a group including TeO$_2$, ZnO, BaO, Nb$_2$O$_5$, SiO$_2$, Al$_2$O$_3$, ZrO$_2$, and/or P$_2$O$_5$. Furthermore, the sealing member 310 may include a filler of various materials to improve characteristics of sealing.

The guide mark 410 is formed on one surface of the second substrate 110. The guide mark 410 is located in an area where the sealing member 310 and the second substrate 110 overlap each other. In other words, the area of the second substrate 110 where the guide mark 410 is located is completely included in an area of the second substrate 110 where the sealing member 310 is located. Accordingly, a width of the guide mark 410 along the Y-axis direction is less than a width of the sealing member 310 along the Y-axis direction.

The guide mark 410 is used to guide a laser beam to be irradiated at an accurate position of the sealing member pattern during formation of the sealing member 310. In general, energy of a laser beam has a Gaussian distribution in which the energy of a center portion of the beam is greater than the energy in a periphery portion of the beam. When the laser beam is not irradiated at the accurate position of the sealing member pattern, then temperature distribution in the sealing member pattern is irregular, so that the sealing member pattern may not be sufficiently melted. Accordingly, a coupling state of the sealing member pattern and the first and second substrates 100 and 110 may be deteriorated. Furthermore, when the laser beam is irradiated toward the active area AA1 of the first substrate 100, the organic film of the display portion located in the active area AA1 may be damaged. Accordingly, according to the present embodiment, the guide mark 410 is formed in the area overlapping the sealing member pattern of the second substrate 110 so that the laser beam may be continuously irradiated at an accurate position along a lengthwise direction of the sealing member pattern.

In one of the methods of forming the guide mark 410 on one surface of the second substrate 110, first, as illustrated in FIG. 2, an upper surface guide mark 410a may be formed on the second substrate 110. In other words, the upper surface guide mark 410a is on a surface of the second substrate 110, opposite to the surface of the second substrate 110 contacting the sealing member 310, and overlapping the sealing member 310 with the second substrate 110 interposed therebetween.

The upper surface guide mark 410a is formed on the same layer as a sensing electrode 420 of a touch screen panel and as a touch screen wiring connected to the sensing electrode 420. Furthermore, the upper surface guide mark 410a may be formed of a same material as the touch screen wiring. The touch screen wiring may be formed of a material that is the same as, or different from, the sensing electrode 420 material. Accordingly, the upper surface guide mark 410a may be formed of a transparent conductive material, such as ITO or IZO or a metal material such as Mo, Ti, or Al.

In another method of forming the guide mark 410 on one surface of the second substrate 110, as illustrated in FIG. 3, a lower surface guide mark 410b may be formed on a surface of the second substrate 110 contacting the sealing member 310. The lower surface guide mark 410b may be formed of a material that is the same as, or similar to, the material of the upper surface guide mark 410a.

The upper surface guide mark 410a and the lower surface guide mark 410b are exposed to a laser beam irradiated from above the second substrate 110 in a process of guiding the laser beam. Accordingly, the upper surface guide mark 410a and the lower surface guide mark 410b may be formed of a heat-resistant material so that it does not melt and so that it is not damaged by high-temperature energy of the laser beam.

In the following description, the shape and arrangement of the guide mark 410 on one plane surface of the second substrate 110 are described with reference to FIGS. 4 to 6. The guide mark 410 may include both of the upper surface guide mark 410a of FIG. 2 and the lower surface guide mark 410b of FIG. 3.

Figure 4:
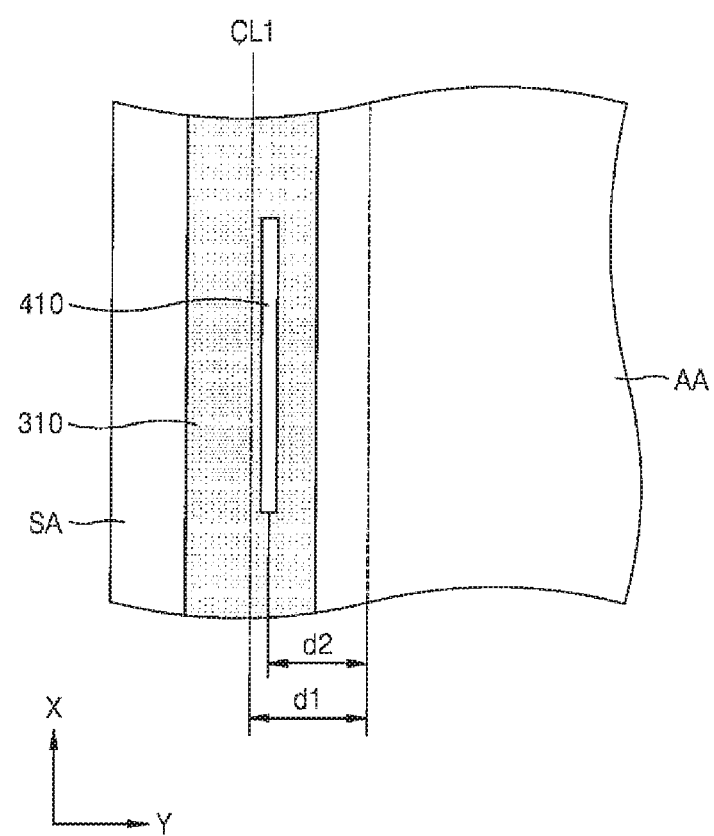
FIG. 4 is an enlarged view schematically illustrating the portion A of FIG. 1.
Figure 5:
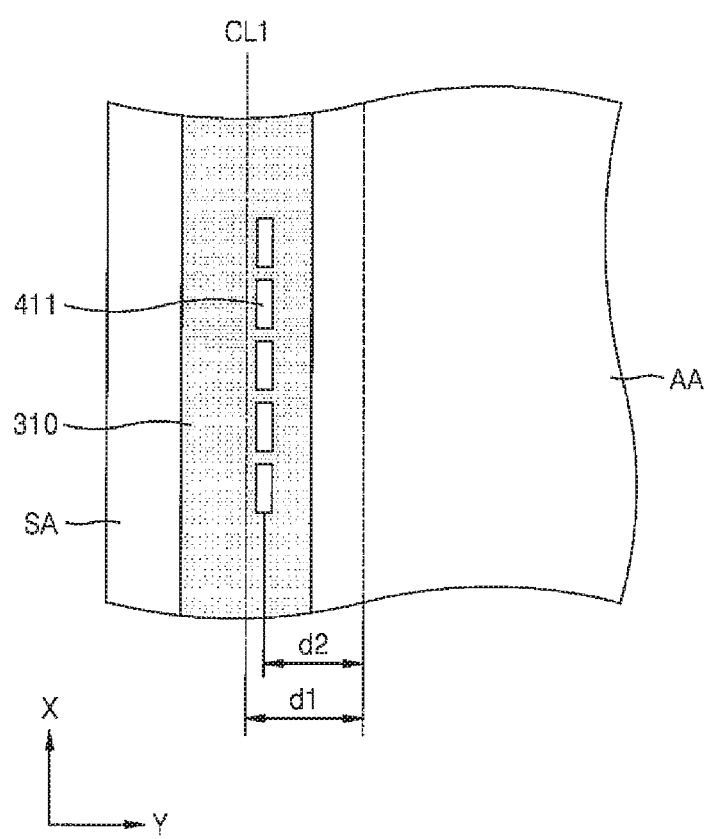
FIG. 5 is an enlarged view schematically illustrating a part of a display apparatus according to another embodiment.
Figure 6:
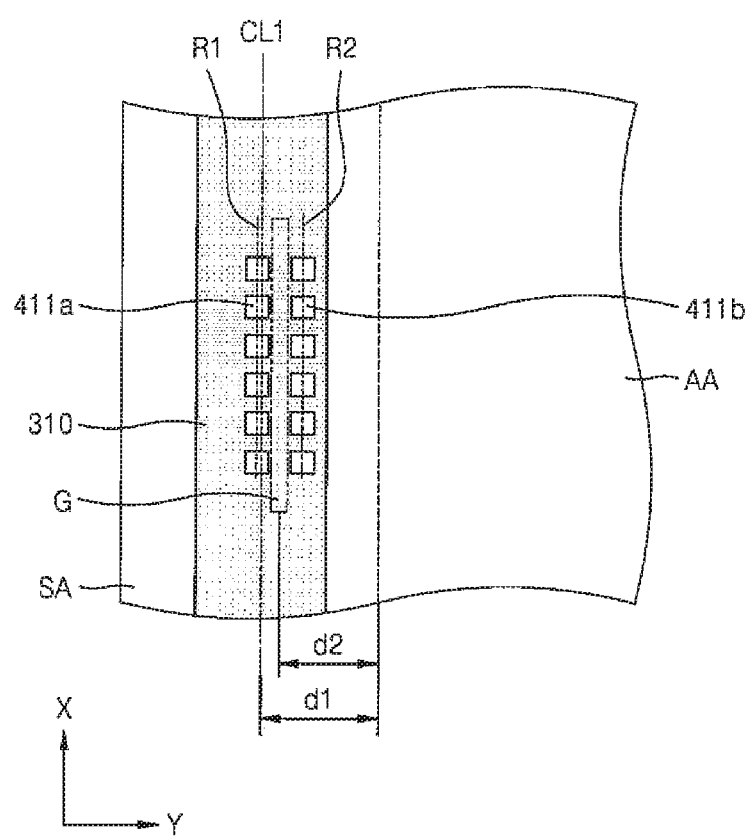
FIG. 6 is an enlarged view schematically illustrating a part of a display apparatus according to another embodiment.

FIG. 4 is an enlarged view schematically illustrating the portion A of FIG. 1, and FIGS. 5 and 6 are enlarged views schematically illustrating parts of display apparatuses according to other embodiments.

First, referring to FIG. 4, the guide mark 410 may have a shape extending in a lengthwise direction of the sealing member 310. Because the guide mark 410 guides the laser beam along the lengthwise direction of the sealing member 310, as described above, the guide mark 410 may be formed substantially parallel to the lengthwise direction of the sealing member 310, that is, may be formed along the X-axis direction.

The guide mark 410 may be formed at a position away from the center of the sealing member 310 (e.g., in the +Y-axis direction). For convenience of explanation, a virtual line located at the center of the sealing member 310 and extending in the lengthwise direction of the sealing member 310 is assumed to be a center line CL1.

Assuming that a distance between the center line CL1 and the active area AA of the first substrate 100 is "d1," and assuming a distance between the guide mark 410 and the active area AA of the first substrate 100 is "d2," then "d2" is shorter than "d1." In this state, "d2" may be a distance from the center of the guide mark 410 to an edge of the active area AA, as illustrated in FIG. 4.

As such, as the guide mark 410 is arranged to be deviated from, or offset from, the center of the sealing member 310 toward the active area AA, the laser beam irradiated onto the guide mark 410 may also be offset from the center of the sealing member 310 toward the active area AA. Accordingly, a thermal influence of the laser beam on an outer portion of the active area AA of the first and second substrates 100 and 110 may be reduced. In detail, when outer portions of the first and second substrates 100 and 110 are excessively influenced by the laser beam, cracks may be generated on a cutting surface of a mother substrate during cutting. The cracks may gradually propagate into the inside of a unit substrate, that is, the first and second substrates 100 and 110, causing serious problems. Such a problem may be easily generated when the mother substrate is a glass material. Accordingly, as the irradiation position of the laser beam is slightly offset in a direction from the center of the sealing member 310 to the active area AA, the generation of cracks in the edges of the first and second substrates 100 and 110, and the propagation of the generated cracks toward the active area AA of the first and second substrates 100 and 110, may be reduced or prevented. Furthermore, as the cutting position of the mother substrate is moved toward the active area AA, a dead space may be reduced. However, when the position of the guide mark 410 is set, it may be useful to take care to prevent constituent elements in the active area AA from being degraded by the laser beam.

The forming of the guide mark 410 at a position offset from the center of the sealing member 310 in the Y-axis direction as described above may be applied to the following embodiments and modified examples thereof.

Referring back to FIG. 1, the guide mark 410 may be formed in a portion of the sealing member 310 extending along the Y-axis. In this case, the guide mark 410 may have a shape extending along the Y-axis direction, corresponding to the shape of the sealing member 310. For example, as illustrated in FIG. 1, the guide mark 410 may be formed at each of four sides of the sealing member 310. Furthermore, the guide mark 410 may be formed in a closed curve, or a perimeter, along the edge of the sealing member 310. This is the same in embodiments described later and modified examples thereof.

Referring to FIG. 5, the guide mark 410 may include a plurality of marks 411. The marks 411 may be arranged to extend in the lengthwise direction of the sealing member 310. In other words, the marks 411 may be arranged to be spaced apart from one another, and to be approximately parallel to one another, or aligned with each other, in the X-axis direction.

Referring to FIG. 6, the guide mark 410 may include a plurality of first marks 411a arranged in a virtual first row R1 extending in the lengthwise direction of the sealing member 310, and may include a plurality of second marks 411b arranged in a virtual second row R2 extending in the lengthwise direction of the sealing member 310. In this state, a distance between the first row R1 and the second row R2 is constant.

Accordingly, a gap area G between the first marks 411a arranged along the first row R1 and the second marks 411b arranged along the second row R2 has a certain width, and the laser beam is irradiated in the gap area G. In other words, the gap area G may be formed at the same position as that of the guide mark 410 of FIG. 4 to thus perform the same function as the guide mark 410 of FIG. 4. Accordingly, the gap area G may be formed at a position offset from the center of the sealing member 310 in the Y-axis direction (e.g., the +Y-axis direction).

Although FIG. 6 illustrates that the first marks 411a and the second marks 411b are arranged adjacent to each other in the Y-axis direction, the present disclosure is not limited thereto, and the first marks 411a and the second marks 411b may be arranged to alternate in a zigzag pattern.

In the following description, a process of manufacturing a display apparatus according to an embodiment is described below with reference to FIGS. 7 to 10.

FIGS. 7 to 10 are cross-sectional view schematically illustrating manufacturing processes of a display apparatus according to an embodiment.

Figure 7:
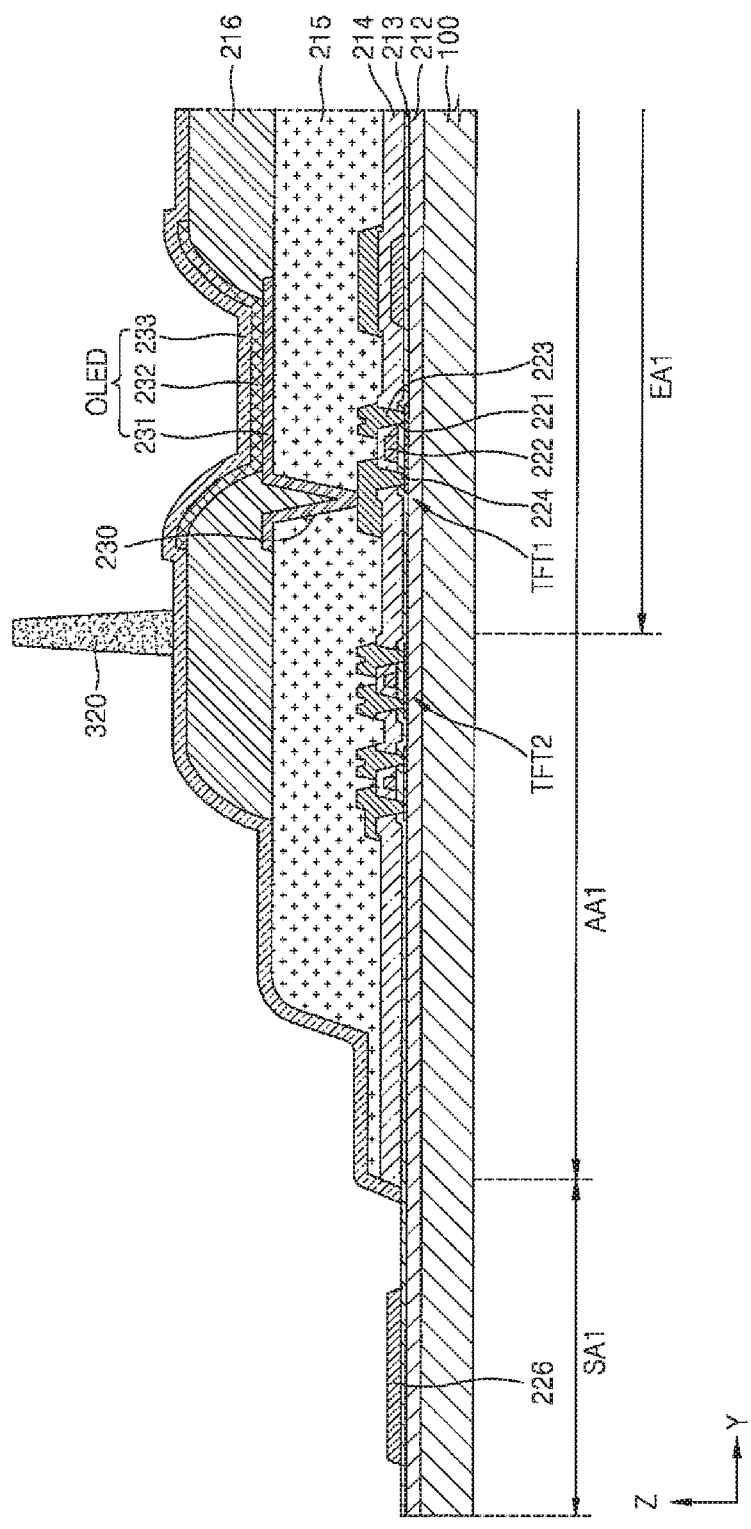
FIGS. 7 to 10 are cross-sectional view schematically illustrating manufacturing processes of a display apparatus according to an embodiment.

First, as illustrated in FIG. 7, the first substrate 100 is prepared, and a display portion is formed on the first substrate 100. The first substrate 100 includes the active area AA1 and the sealing area SA1 surrounding the active area AA1. The light-emitting area EA1 for emitting light to the outside is defined in the active area AA1. The display portion is formed in the active area AA1 of the first substrate 100. The OLED provided in the display portion is formed in the light-emitting area EA1. Because a manufacturing process of other constituent elements provided in the OLED and the display portion is redundant with the description presented above with reference to FIGS. 1 to 3, descriptions thereof are omitted.

Figure 8:
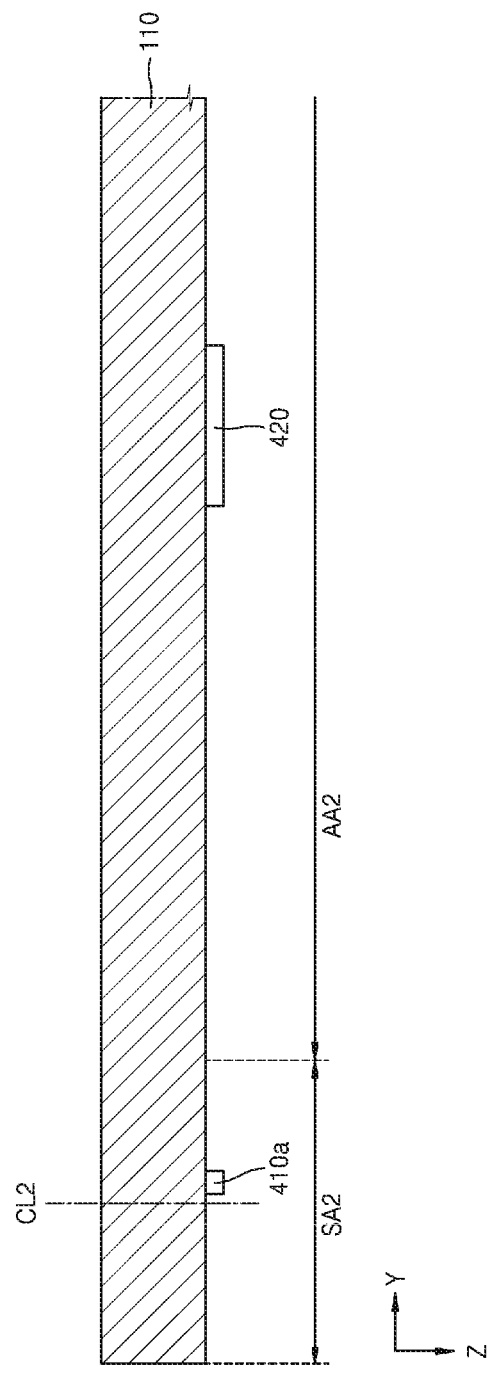

Next, as illustrated in FIG. 8, the second substrate 110 is prepared and the upper surface guide mark 410a is formed on one surface of the second substrate 110. In this case, the second substrate 110 may include an active area AA2 and a sealing area SA2, respectively corresponding to the active area AA1 and the sealing area SA1 of the first substrate 100. The upper surface guide mark 410a is located within the sealing area SA2 of the second substrate 110. In other words, an area of the second substrate 110 where the upper surface guide mark 410a is formed is completely surrounded by the sealing area SA2 of the second substrate 110.

The upper surface guide mark 410a may be formed on the same layer as the sensing electrode 420 of the touch screen panel and/or the touch screen wiring connected to the sensing electrode 420. Furthermore, the upper surface guide mark 410a may be formed of the same material as the material of the sensing electrode 420 of the touch screen panel and/or the touch screen wiring. In this case, the upper surface guide mark 410a, the sensing electrode 420, and/or the touch screen wiring may be formed in the same process.

Although FIG. 8 illustrates that the upper surface guide mark 410a is formed on the same layer as the sensing electrode 420 and/or the touch screen wiring, the present disclosure is not limited thereto. In other words, as illustrated in FIG. 3, the lower surface guide mark 410b may be formed on a surface (e.g., an inner surface) of the second substrate 110 that is opposite to the surface (e.g., an outer surface) of the second substrate 110 where the sensing electrode 420 and/or the touch screen wiring are formed. In this case, a process of forming the lower surface guide mark 410b may be added in addition to the process of forming the sensing electrode 420 and/or the touch screen wiring. For convenience of explanation, a case in which the upper surface guide mark 410a is formed on the same layer as the sensing electrode 420 and/or the touch screen wiring is mainly described below.

Figure 9:
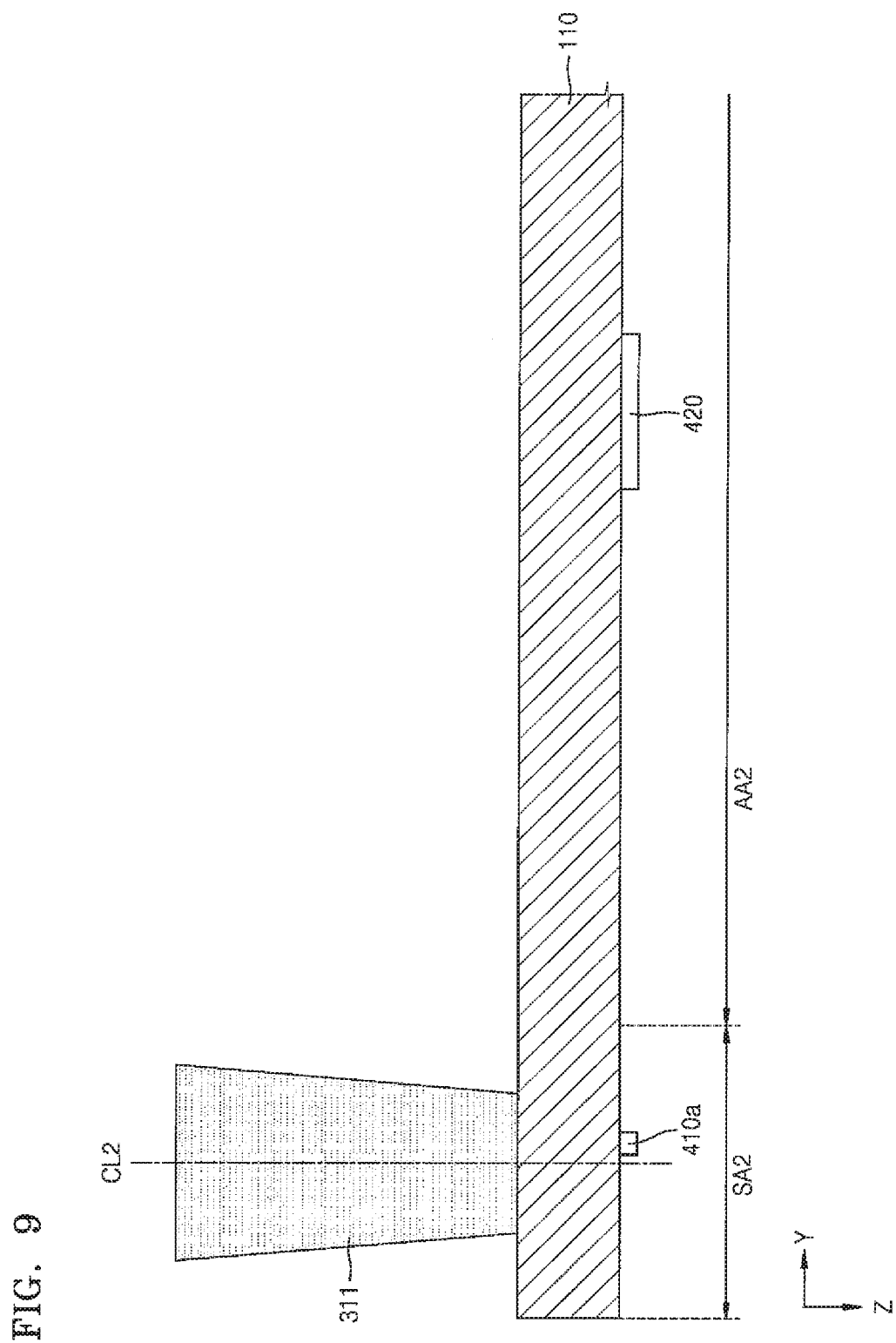

Next, as illustrated in FIG. 9, a sealing member pattern 311 is formed in the sealing area SA of the second substrate 110. In this state, the sealing member pattern 311 is formed such that the upper surface guide mark 410a that is already formed on one surface of the second substrate 110 is located in an area where the sealing member pattern 311 and the second substrate 110 overlap each other. In other words, an area of the second substrate 110 where the upper surface guide mark 410a is located is completed surrounded by an area of the second substrate 110 where the sealing member pattern 311 is located.

Furthermore, the sealing member pattern 311 may be formed such that a distance between the upper surface guide mark 410a and the active area AA2 of the second substrate 110 is shorter than a distance between the center of the sealing member pattern 311 and the active area AA2 of the second substrate 110. For convenience of explanation, it is assumed that a virtual line located at the center of the sealing member pattern 311 and extending in a thickness direction of the sealing member pattern 311 (e.g., extending in a Z-axis direction) is a center line CL2. In this case, the sealing member pattern 311 is formed such that the center line CL2 of the sealing member pattern 311 is further spaced apart from the active area AA2 than the upper surface guide mark 410a.

Figure 10:
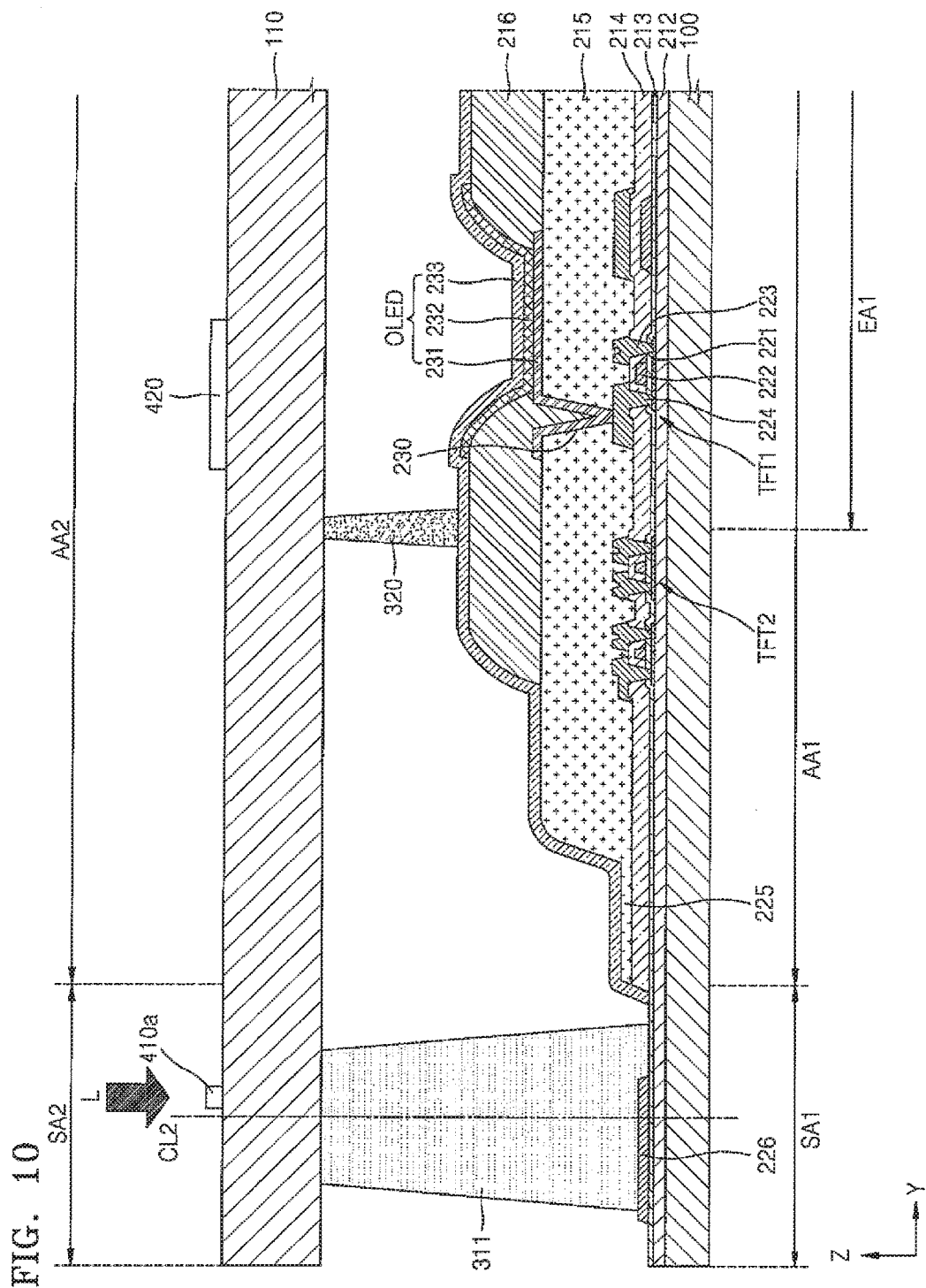

Next, as illustrated in FIG. 10, the second substrate 110 is arranged above the first substrate 100 such that the sealing area SA1 of the first substrate 100 faces the sealing area SA2 of the second substrate 110.

Then, a laser beam L is irradiated onto the upper surface guide mark 410a formed on one surface of the second substrate 110 to melt the sealing member pattern 311. As the laser beam L is guided by using the upper surface guide mark 410a, the laser beam L may be irradiated at the accurate position of the sealing member pattern 311.

In this state, the laser beam L may be irradiated onto the guide marks 410 and 411 arranged along one row as illustrated in FIGS. 4 and 5. In another example, the laser beam L may be irradiated onto guide marks arranged in a plurality of rows. For example, as illustrated in FIG. 6, when the first marks 411a are arranged along the first row R1 and the second marks 411b are arranged along the second row R2 that is next to the first row R1, the laser beam L may be irradiated in the gap area G between the first marks 411a and the second marks 411b.

Then, the sealing member 310, as illustrated in FIG. 1, is formed by curing the sealing member pattern 311 melted by the laser beam L. As such, one end of the sealing member 310 in the −Z-axis direction, and one end of the sealing member 310 in the +Z-axis direction, are respectively attached to the first substrate 100 and the second substrate 110 through the process in which the sealing member pattern 311 is melted and then cured. Accordingly, the display portion surrounded by the first substrate 100, the second substrate 110, and the sealing member 310 may be sealed.

As described above, a display apparatus, which may improve a degree of accuracy in a position between the sealing member and the laser beam and also reduce a dead space outside the sealing member, may be embodied, and a manufacturing method thereof may be embodied.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims and their equivalents.

What is claimed is:

1. A method of developing a display apparatus, the method comprising:
preparing a first substrate having an active area, and a sealing area surrounding the active area;
developing a display portion in the active area of the first substrate;
preparing a second substrate having an active area and a sealing area respectively corresponding to the active area and the sealing area of the first substrate;
developing a guide mark on a first surface of the second substrate in the sealing area of the second substrate;
developing a sealing member pattern in the sealing area of the first substrate or in the sealing area of the second substrate;
arranging the second substrate above the first substrate such that the sealing area of the first substrate faces the sealing area of the second substrate, and such that the sealing member pattern is at a second surface of the second substrate, the second surface being opposite to the first surface;
melting the sealing member pattern at the second surface of the second substrate by irradiating a laser beam onto the guide mark at the first surface of the second substrate; and
developing a sealing member by curing the sealing member pattern.

2. The method of claim 1, further comprising developing a touch screen wiring of a same material as the guide mark, wherein the touch screen wiring and the guide mark are simultaneously formed.

3. The method of claim 1, wherein the guide mark is located within an area where the sealing member pattern and the second substrate overlap each other, and wherein a width of the guide mark is smaller than a width of the sealing member.

4. The method of claim 1, wherein the guide mark has a shape extending in a lengthwise direction of the sealing member.

5. The method of claim 1, wherein the guide mark comprises a plurality of marks each having a shape extending in a lengthwise direction of the sealing member.

6. The method of claim 1, wherein the guide mark comprises:
a plurality of first marks arranged along a virtual first row extending in a lengthwise direction of the sealing member; and
a plurality of second marks arranged along a virtual second row extending in the lengthwise direction of the sealing member.

7. The method of claim 6, wherein a distance between respective ones of the first marks and respective ones of the second marks is substantially constant.

8. The method of claim 6, wherein the melting the sealing member pattern by irradiating a laser beam onto the guide mark comprises irradiating the laser beam in a gap area between the plurality of first marks and the plurality of second marks.

9. The method of claim 1, wherein the melting the sealing member pattern by irradiating a laser beam onto the guide mark comprises irradiating the laser beam in a direction from the second substrate to the first substrate.

10. The method of claim 1, wherein the guide mark comprises a heat-resistant material.

11. A method of developing a display apparatus, the method comprising:
preparing a first substrate having an active area, and a sealing area surrounding the active area;
developing a display portion in the active area of the first substrate;
preparing a second substrate having an active area and a sealing area respectively corresponding to the active area and the sealing area of the first substrate;
developing a guide mark on one surface of the second substrate in the sealing area of the second substrate;
developing a sealing member pattern in the sealing area of the first substrate or in the sealing area of the second substrate;
arranging the second substrate above the first substrate such that the sealing area of the first substrate faces the sealing area of the second substrate;
melting the sealing member pattern by irradiating a laser beam onto the guide mark; and
developing a sealing member by curing the sealing member pattern,
wherein a center line of the guide mark is located closer to the active area than a center line of the sealing member when viewed form above the second substrate.

* * * * *